Aug. 29, 1967 C. U. DARTER ET AL 3,339,127

SEMICONDUCTOR HOUSING

Filed Nov. 18, 1964

INVENTOR.
Cederick U. Darter
Philip L. Clar

BY Mueller & Aichele

ATTYS.

United States Patent Office 3,339,127
Patented Aug. 29, 1967

3,339,127
SEMICONDUCTOR HOUSING

Cederick U. Darter and Philip L. Clar, Phoenix, Ariz., assignors to Motorola, Inc., Chicago, Ill., a corporation of Illinois Filed Nov. 18, 1964, Ser. No. 412,108
8 Claims. (Cl. 317—234)

The present invention relates to an improved housing for miniaturized semiconductors, and, more particularly, to an imporved coaxial housing for a high frequency type of transistor unit. The improved housing of the invention, for example, permits a high frequency transistor unit to be mounted directly in high frequency resonant tank circuits.

In the present state of the art, the usual transistors such as the germanium mesa or silicon planar diffused junction types, for example, for very high frequency and microwave frequency use, are extremely small in size. This presents difficulties in providing a suitable housing for such miniature transistor units, which housing will enable the units to be conveniently mounted in the equipment in which they are to be used. Such housings in the past, for the most part, have been complicated and difficult to assemble.

It is an object of the present invention to provide an improved housing for high frequency transistors, or the like, which is extremely simple to assemble and which is constructed so that the transistor may be conveniently mounted therein and connected into an associated high frequency circuit.

Another object of the invention is to provide such an improved housing which is low in cost, and which is particularly suitable for very high frequency and microwave frequency use.

A feature of the improved housing of the invention is the fact that it is self-aligning for ease of assembly, and that it permits usual connection techniques to be used in connecting the transistor unit into the housing.

Another feature of the improved housing of the invention is that it may be constructed to provide large area and low resistance contacts with short wire connections, so as to minimize lead inductance and resistance. The contact areas are so devised and constructed that capacitive cross-coupling between input and output leads is reduced to a minimum.

Figure 1:
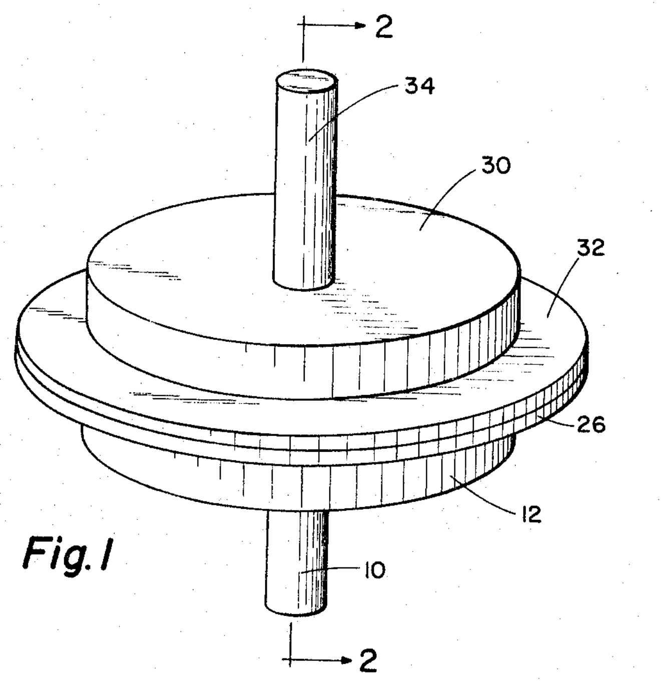
Figure 2:
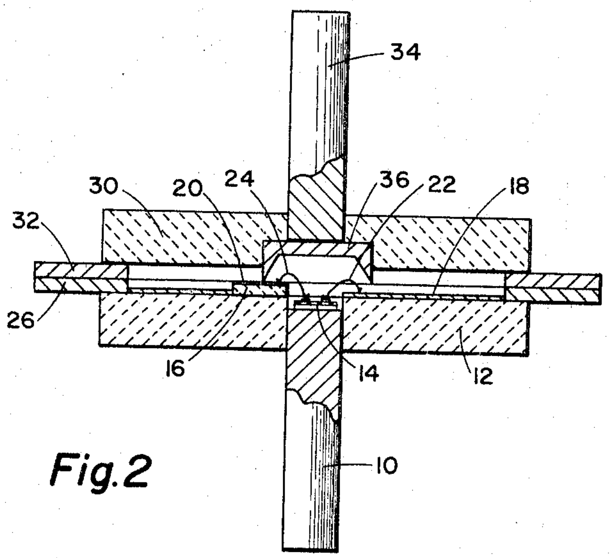

Other objects, advantages and features of the invention will become apparent from a consideration of the following specification, when the specification is taken in conjunction with the accompanying drawing, in which:

FIG. 1 is a perspective view, on an enlarged scale, of an improved high frequency transistor housing, which may be constructed in accordance with the concepts of the invention; and FIG. 2 is a sectional view, taken substantially along the line 2—2 of FIG. 1, of the transistor housing of FIG. 1.

As shown in the drawing, the transistor housing includes an elongated conductive member in the form, for example, of a metallic pin 10, which may be composed of molybdenum or copper. The pin 10 extends into a central aperture in an insulating disc-like member 12. The disc-like member 12 may be composed, for example, of a suitable ceramic, such as berillia or alumina. Berillia may be used in applications where its characteristic of high heat conductivity may be utilized to advantage.

As shown in FIG. 2, the inner end of the pin 10 is displaced below the inner surface of the disc-like member 12, so as to define a pocket. A transistor unit 14 may be supported in the pocket, as shown. The transistor 14 may be a usual type of planar, high frequency, diffusion transistor, for example, including a semiconductor wafer.

The back surface of the semiconductor wafer may be metallized to constitute the collector contact. This metallized surface of the wafer 14 may be bonded directly to the inner end of the pin 10. The pin 10, therefore, serves as a support for the semiconductor wafer; it also serves as a collector lead, and as a heat sink for heat developed in the wafer.

It will be appreciated, therefore, that in order to mount the transistor 14 in the housing of the invention, it is merely necessary to place the transistor in the pocket and on the inner end of the pin 10, and then, by the application of usual transistor techniques, to bond the collector contact of the transistor to the inner end of the pin.

An insulating block member 16, which may be in the form of a ceramic chip, is affixed to the inner surface of the member 12 adjacent the pocket formed by the displaced inner end of the pin 10. The top surface of the member 12 is metallized, so as to provide a conductive layer 18. This layer may be formed of any appropriate conductive material, and it may be formed on the inner surface of the member 12 by vapor deposition, sputtering, or any other known technique. The conductive layer 18 is insulated from the displaced inner end of the pin 10.

The top surface of the block 16 is also made conductive, as by a metallic layer 20. This layer may also be formed of any appropriate conductive material, and it too may be deposited by any known technique. It will be appreciated, however, that the conductive layer 20 is insulated by the block 16 from the conductive layer 18.

The emitter and base contacts of the transistor 14 may be connected respectively to the metallic layers 18 and 20 (or vice versa), for example, by small wires 22 and 24. The construction is such that these wires can be short in length so as to minimize the inductance and resistance thereof. The wires 22 and 24 may be attached to the emitter and base contacts, and to the conductive layers 18 and 20, by any usual thermocompression bonding technique or the like, such as are in general use in fabricating miniature transistors.

An annular member 26 is affixed to the outer edge of the disc-like member 12 in coaxial relationship with the dics-like member. The ring member 26 extends radially beyond the peripheral edge of the disc-like member 12. The ring 26 is in electrical contact with the layer 18 which, in turn, is connected to the transistor emitter (or base) contact by the wire 22. Therefore, the ring 26 forms an external contact for the base (or emitter) of the transistor.

The housing also includes a cover which, in turn, includes a disc-like member 30. The member 30 may also be composed of a ceramic, and it may be of the same size and shape as the disc-like member 12. A further metallic ring member 32 is bonded to the member 30 in coaxial relationship with the member 30, and in position to engage the ring 26 when the disc-like member 30 is brought into the position shown in the drawing. The ring members 26 and 30 may then be soldered, welded, or otherwise joined together, so as to hold the assembly in an assembled condition.

A central elongated conductive member, in the form of a metallic pin 34, extends through a central aperture in the disc-like cover member 30. This pin may be composed, for example, of copper, or other suitable conductive material. A cup-shaped member 36, also composed of a suitable conductive material, is affixed to the inner end of the pin 34, or may be made integral therewith.

The cup-shaped member 36 is shaped and positioned so that its peripheral edge contacts the metallized layer 20 on the block 16, when the cover is in place, as shown in FIG. 2. This provides a connection from the emitter (or base) of the transistor 14, through the wire 24, and through the layer 20 to the cup-shaped member 36. The pin 34 may therefore serve as a contact terminal for the emitter (or base) of the transistor.

The ring members 26 and 32 may be composed of a suitable alloy material, such as Kovar, so that their coefficient of expansion will equalize the coefficient of expansion of the disc-like members 12 and 30.

An advantage of the housing herein described, and shown in the accompanying drawing, is that it permits the transistor 14 to be mounted directly in cavity-type collector tank and base (or emitter) tank circuits. For such mounting, two coaxial cavities can be provided, one constituting the collector tank circuit, and the other the base (or emitter) tank circuit. One of these cavities may be fitted directly over the disc-like member 30 to abut against the ring 32 and the other may be fitted over the disc-like member 36 to abut against the ring 26.

It will be appreciated that when mounted between the two cavities as described, the assembly itself provides an essentially grounded shield for optimum isolation. This is because the conducting layer 18 is grounded, and extends over almost the entire area within the rings 26 and 32. In addition, the grounded contact (base or emitter) has a large area, for minimum inductance and low resistance. This provides for low attenuation at the higher frequencies, so as to extend the frequency range of the unit.

It should be noted, for example, that there is low capacity between the pin 10, for example, and the ring 26 and conducting layer 18, assuming that the ring is grounded. This is because the plane of the ring 26 is perpendicular to the axis of the pin, so that the surfaces thereof provide minimum capacitive effect. Therefore, there are no objectionable parasitics of any appreciable amplitude generated within the housing, and any desired cavity input impedance can be chosen, without capacitive loading of the cavity by the collector circuit.

As previously mentioned, a further advantage of the structure of the present invention is the ease by which the transistor 14 can be mounted and connected into the housing assembly. That is, the semiconductor chip constituting the transistor 14 may be easily mounted in the pocket formed in the inner end of the pin 10 and bonded to the inner end of the pin by usual bonding techniques. Then, by use of known transistor methods, the wires 22 and 24 may be attached to the emitter and base contacts of the transistor by usual thermocompression techniques, as mentioned.

The housing assembly itself is easy to assemble and is self-aligning. It is merely necessary, for example, to line up the two central pins 10 and 34 in a welding jig, and to bring the two disc-like members 12 and 30 into place and then to weld, or otherwise join together the rings 26 and 32.

The housing assembly of the present invention, therefore, is extremely easy to assemble, and it can be constructed at a relatively low cost. The housing provides an efficient coaxial transistor package for very high frequencies and microwave usages.

While a particular embodiment of the invention has been shown and described, many modifications may be made. It is intended in the following claims to cover all such modifications as fall within the true scope and spirit of the invention.

What is claimed is:

1. A housing for a semiconductor unit, including in combination: a first insulating member having an inner surface and having an aperture formed therein; an elongated first conductive member extending into said aperture and positioned therein with the inner end thereof displaced from said inner surface of said first insulating member to define a pocket; a block member formed of insulating material affixed to said inner surface of said first insulating member adjacent said aperture therein; a first conductive layer formed on the inner surface of said first insulating member; a second conductive layer formed on the top surface of said block member and insulated by said block member from said first conductive layer on the inner surface of said first insulating member; a second insulating member having an inner surface and an outer surface and having an aperture therein; an elongated second conductive member extending through said aperture in said second insulating member and having an inner end positioned to contact said second conductive layer on said top surface of said block member, and means for holding said first and second insulating members in assembled relation.

2. A housing for a semiconductor unit, including in combination: a first disc-like insulating member having an inner surface and having a central aperture formed therein; a first metallic pin extending into said central aperture and positioned therein with the inner end thereof displaced below said inner surface of said first disc-like insulating member; a first metallic layer formed on the inner surface of said first disc-like insulating member; a block member formed of insulating material and affixed to said inner surface of said first disc-like member adjacent said central aperture therein; a second metallic layer formed on the top surface of said block member and insulated by said block member from said first conductive layer on said inner surface of said first disc-like insulating members; a second disc-like insulating member having an inner surface and having a central aperture therein; and a second metallic pin extending through said central aperture in said second disc-like insulating member and having an inner end protruding from said inner surface of said second disc-like insulating member in position to contact said second metallic layer on said top surface of said block member when said first and second disc-like members are brought together.

3. The housing defined in claim 2 in which said first and second disc-like members and said block member are formed of a ceramic material.

4. The housing defined in claim 2 and which includes a first coaxial annular member affixed to the inner surface of said first disc-like member adjacent the periphery thereof and in electrical contact with said first metallic layer on said surface and extending radially beyond the periphery of said first disc-like member, and a second coaxial metallic annular member affixed to the inner surface of said second disc-like member in position to be adjacent said first annular member when said first and second disc-like members are brought together, so as to provide a means for securing said first and second disc-like members together into an assembled unit.

5. A housing for a transistor unit, and the like, including in combination: a first disc-like insulating member having an inner surface and having a central aperture formed therein; a first conductive pin extending into said central aperture and positioned therein with the inner end thereof displaced below said inner surface of said first disc-like insulating member; a first conductive layer formed on the inner surface of said first disc-like insulating member; a block member formed of insulating material affixed to said inner surface of said first disc-like member adjacent said central aperture therein; a second conductive layer formed on the top surface of said block member and insulated by said block member from said first conductive layer on said inner surface of said first disc-like member; a first annular member of conductive material affixed to said inner surface of said first disc-like member in coaxial relationship therewith and in contact with said first conductive layer and extending radially beyond the periphery of said first disc-like insulating member; a second disc-like insulating member having an inner surface and having a central aperture therein; a second conductive pin extending through said central aperture in said second disc-like insulating member and having a cup-shaped inner end with a peripheral rim in position to contact said second conductive layer on said top surface of said block member when said first and second disc-like members are brought together; and a second annular member of conductive material affiexed to said inner surface of said second disc-like member in coaxial relationship therewith and extending radially beyond the periphery thereof to be in axial alignment with said first annular member when said first and second disc-like members are brought together.

6. A housing for a transistor unit, and the like, including in combination: a first disc-like insulating ceramic member having an inner surface and having a central aperture formed therein; a first metallic pin extending into said central aperture and positioned therein with the inner end thereof displaced below said inner surface of said first disc-like insulating member; a first metallic layer formed on the inner surface of said first disc-like insulating member; a block member formed of insulating ceramic material affixed to said inner surface of said first disc-like member adjacent said central aperture therein; a second metallic layer formed on the top surface of said block mmeber and insulated by said block member from said first metallic layer; a first coaxial annular metallic member affixed to said inner surface of said first disc-like member in contact with said first conductive layer and extending radially beyond the periphery of said first disc-like insulating member; a second disc-like insulating ceramic member having an inner surface and having a central aperture therein; a second metallic pin extending through said central aperture in said second disc-like insulating member and having a cup-shaped inner end with a peripheral rim in position to contact said second metallic layer on said top surface of said block member when said first and second disc-like members are brought together; and a second coaxial annular metallic member affixed to said inner surface of said second disc-like member and extending radially beyond the periphery thereof to be in axial alignment with said first annular member to be affixed thereto when said first and second disc-like members are brought together.

7. A housing for a semiconductor unit, including in combination: a first disc-like insulating ceramic member having an inner surface and having a central aperture formed therein; a first conductive metallic pin extending into said central aperture and positioned therein with the inner end thereof displaced from said inner surface of said first disc-like insulating member to form a pocket; a block member formed of insulating ceramic material affixed to said inner surface of said first disc-like member adjacent said central aperture therein; a first conductive metallic layer formed on the inner surface of said first disc-like insulating member; a second conductive metallic layer formed on the top surface of said block member and insulated by said block member from said first metallic layer; a coaxial annular metallic conductive structure affixed to said inner surface of said first disc-like member in contact with said first conductive layer and extending radially beyond the periphery of said first disc-like insulating member; a second disc-like insulating ceramic member having an inner surface and having a central aperture therein; and a second metallic pin extending through said central aperture in said second disc-like insulating member and having an inner end portion in position to contact said second conductive layer on said top surface of said block member when said first and second disc-like members are brought together; said inner surface of said second disc-like member being affixed to said annular metallic structure with said first and second disc-like members in axial alignment.

8. A housing for a semiconductor unit, including a combination: a first disc-like insulating ceramic member having an inner surface and having a central aperture formed therein; a first conducting pin extending into said central aperture and positioned therein with the inner end thereof displaced from said inner surface of said first disc-like insulating member to form a pocket; a block member formed of insulating ceramic material affixed to said inner surface of said first disc-like member adjacent said central aperture therein; a first conducting layer formed on the inner surface of said first disc-like insulating member; a second conducting layer formed on the top surface of said block member and insulated by said block member from said first conducting layer; a coaxial annular conductor affixed to said inner surface of said first disc-like member in contact with said first conducting layer and extending radially beyond the periphery of said first disc-like insulating member; a second disc-like insulating ceramic member having an inner surface and having a central aperture therein; and a second conducting pin extending through said central aperture in said second disc-like insulating member and having an inner end contacting said second conducting layer on said top surface of said block member to make an electrical connection therewith; said inner surface of said second disc-like member being affixed to said annular conductor in position so that said first and conducting pins are in axial alignment.

No references cited.

JOHN W. HUCKERT, *Primary Examiner.*

A. M. LESNIAK, *Assistant Examiner.*